United States Patent
Johnson

(10) Patent No.: US 6,630,364 B2
(45) Date of Patent: Oct. 7, 2003

(54) SYSTEM FOR AUTOMATIC CONTROL OF THE WALL BOMBARDMENT TO CONTROL WALL DEPOSITION

(75) Inventor: Wayne L. Johnson, Phoenix, AZ (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/149,452

(22) PCT Filed: Dec. 29, 2000

(86) PCT No.: PCT/US00/35575

§ 371 (c)(1),
(2), (4) Date: Jun. 27, 2002

(87) PCT Pub. No.: WO01/47646

PCT Pub. Date: Jul. 5, 2001

(65) Prior Publication Data

US 2002/0192359 A1 Dec. 19, 2002

Related U.S. Application Data

(60) Provisional application No. 60/173,495, filed on Dec. 29, 1999.

(51) Int. Cl.[7] .......................... G01R 31/26; H01L 21/66
(52) U.S. Cl. ............................. 438/14; 427/10; 427/9; 438/17
(58) Field of Search .................... 438/14, 17; 427/10, 427/569, 227, 9; 134/1.1, 1.2, 22.1; 216/68

(56) References Cited

U.S. PATENT DOCUMENTS

| 5,514,246 | A | 5/1996 | Blalock |
| 5,817,534 | A | 10/1998 | Ye et al. |
| 6,425,953 | B1 * | 7/2002 | Johnson .................... 134/1 |
| 6,535,785 | B2 * | 3/2003 | Johnson et al. ............. 700/121 |

* cited by examiner

Primary Examiner—Alexander Ghyka
(74) Attorney, Agent, or Firm—Oblon, Spivak, McClelland, Maier & Neustadt, P.C.

(57) ABSTRACT

A method and system for controlling the bombardment of a wall (100) of an electrically shielded RF (ESRF) source to control wall deposition. By measuring thickness of a deposit on a wall (100), the method and system can determine how to control the bias voltage applied to the bias shield (105) of the ESRF source. Thickness can be measured using any measurement technique (e.g., microwave, eddy current probe, capacitive probe and interferometric).

12 Claims, 7 Drawing Sheets

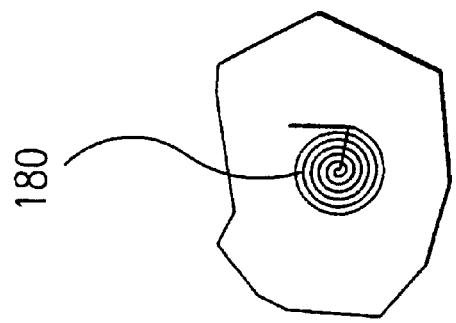
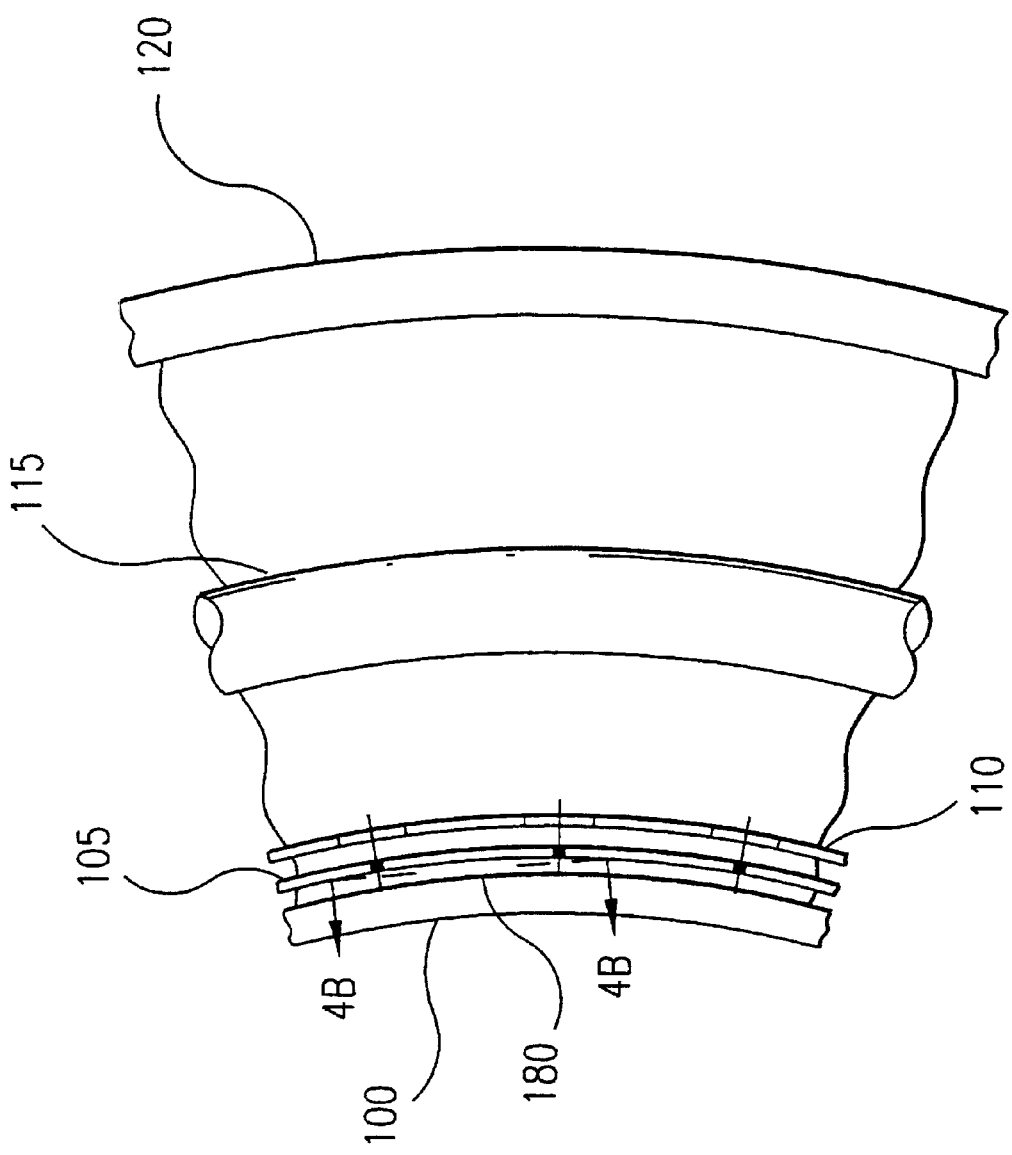

SYSTEM FOR AUTOMATIC CONTROL OF THE WALL BOMBARDMENT TO CONTROL WALL DEPOSITION

This application is a 371 of PCT/VS00/35575, filed Dec. 20, 2001, which claims benefit to U.S. application Ser. No. 60/173,495, filed Dec. 29, 1999.

BACKGROUND OF THE INVENTION

1. Field of the Invention

The present invention is directed to a method and system for measuring and controlling the thickness of coatings or films deposited on the walls of and surfaces within a plasma processing chamber during etch and/or deposition processes.

2. Discussion of the Background

Depending on the particular processes for which a plasma processor has previously been used, the composition and morphology of coatings or films on the processor walls can vary. For example, in Plasma Enhanced Chemical Vapor Deposition (PECVD) processing, the deposition material is, in fact, deposited not only on the semiconductor wafer being processed, but also on virtually every exposed surface within the reactor.

Similarly, during plasma etching, some of the material removed from the wafers will coat virtually all exposed surfaces of the reactor, rather than be removed from the reactor by the vacuum pump. For example, in the oxide plasma photoresist etch process, the walls acquire a coating of organic material that includes both photoresist redeposited by the plasma and plasma-polymerized etch gas. The removal of such deposits by ion bombardment may involve sputtering or some form of a chemically assisted process such as low pressure ashing. These coatings may affect the performance of the plasma processor in different ways. In particular, if the thickness of a coating becomes sufficiently great, coating fragments may dislodge and cause particulate contamination of the plasma processor. Similarly, the surfaces of semiconductor wafers are detrimentally contaminated as well.

Another problem may arise if the coating is subject to sputtering or evaporation during a plasma process. In such cases, molecules, atoms, ions, etc. of the coating may alter the plasma chemistry and, thereby, affect the plasma process. Furthermore, it is also possible for such constituents of the plasma to be incorporated in a film being deposited on a wafer, with potentially undesirable consequences.

Techniques have been developed for removing coatings or films deposited on the walls of an inductively coupled plasma reactor. For example, Blalock (U.S. Pat. Nos. 5,514, 246 and 5,647,913) describes an apparatus for cleaning the interior surfaces of the walls of an inductively coupled plasma reactor. In Blalock, the reaction chamber is bounded by a dome-shaped shell constructed from an insulating material (e.g. alumina or quartz) and an electrically conducting, grounded base plate. Exterior to the dome-shaped shell there is a helical coil that is excited by an Radio Frequency (RF) signal. A metallic (i.e., electrically conducting) electrostatic shield is placed between the outer wall of the insulating reactor and the helical excitation coil. This electrostatic shield prevents any capacitive coupling between the RF induction coil and the plasma. The metallic shield typically has a number of slots directed in such a way as to substantially eliminate eddy currents that would, in the absence of the slots, be excited in the metallic shield by the RF current in the induction coil. In Blalock, a switch connects the electrostatic shield either to an RF ground or to an RF signal source, depending on the particular intended procedure. This configuration reduces the effectiveness of the RF ground.

In a typical deposition or etch process, gases appropriate for the intended purpose are introduced into the reaction chamber and the plasma is excited by means of a nominally sinusoidal RF current that flows in the induction coil. The frequency of the exciting RF current is typically in the range from a few MHZ to 100+MHZ. A common frequency is 13.56 MHZ. In practice, however, the exciting RF current may include significant harmonic components due to the complicated interactions between the plasma and the RF source.

For a cleaning procedure, Blalock teaches that the ground connection to the electrostatic shield is to be removed, the shield is to be connected to an RF signal source, and gases appropriate for the removal of the films previously deposited on the surfaces inside the reaction chamber are to be introduced into the reaction chamber. The plasma is then excited by capacitive means, using the electrostatic shield as one electrode and one or more conductors inside the reaction chamber as the other electrode(s). The interior surfaces of the reaction chamber are subjected to the plasma until the unwanted, previously deposited films have been removed.

SUMMARY OF THE INVENTION

It is one object of the present invention to measure film/coating growth in a plasma processing system.

It is another object of the present invention to control film/coating growth in a plasma processing system.

It is yet another object of the present invention to provide a better RF ground than known prior art systems.

These and other objects of the present invention are provided in part by introducing a second conducting shield, referred to hereinafter as a "bias shield," between the exterior reaction chamber wall and the electrostatic shield. Moreover, the present invention monitors various constituents in the vacuum system exhaust gases during cleaning via one or both of two techniques. The first technique uses microwave transmission and reflectometry, and the second technique uses optical interference and reflectometry.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 4A is a top, sectional view showing the location of an eddy current coil;

FIG. 4B is a schematic illustration of the configuration of the eddy current coil shown in FIG. 4A;

DESCRIPTION OF THE PREFERRED EMBODIMENTS

Figure 1:
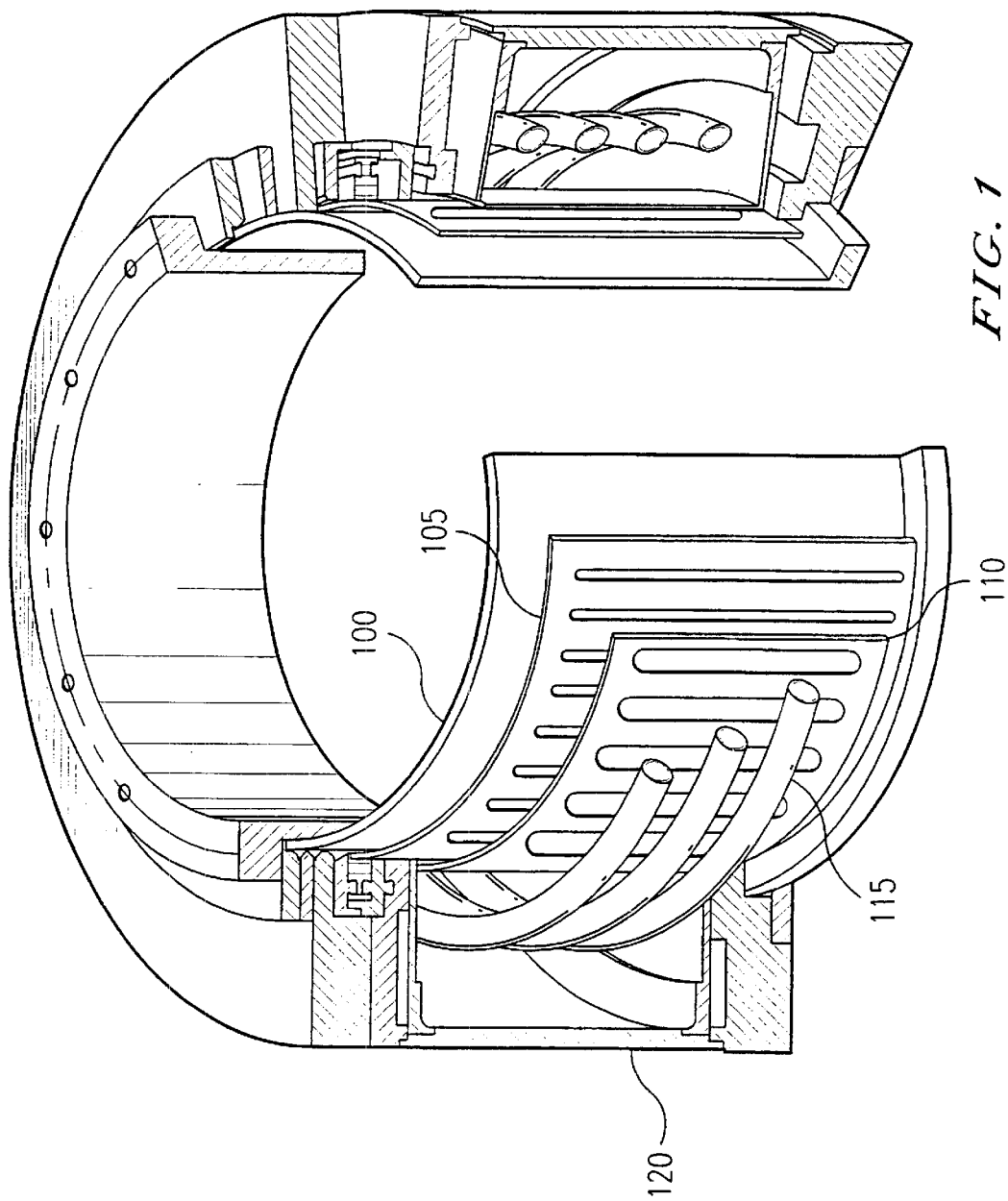
FIG. 1 is a cut-away top-view of an ESRF source with both an electrostatic shield and a bias shield according to the present invention.

FIG. 1 is a cut-away top-view of an ESRF source with both an electrostatic shield and a bias shield according to the present invention. The source 120 includes a bias shield 105 interposed between the electrostatic shield 110 and the outer wall of the process tube (i.e., the reaction chamber) 100. The bias shield 105 is connected to a source of RF energy, which provides energy to a plasma inside the process tube 100 during chamber cleaning procedures. The electrostatic shield 110 is provided with a new RF ground, which is always in place.

The bias shield 105 also is used in wafer processes to affect the morphology, composition, and deposition rate of films deposited on exposed surfaces within the process tube 100.

During a typical plasma process involving one or more wafers (as opposed to a process whose only purpose is cleaning the process chamber), the application of RF power to the bias shield 105 causes process ions to be accelerated to the reaction chamber wall. Depending on various factors (e.g., RF power level, gas composition, and film composition), several processes are possible upon ion collision. For example, if the RF power level is low, the ions impinging on the wall will have low energies and will, in effect, increase the apparent temperature at the wall surface. The usual consequences are that the coating or film growing on the wall will tend (1) to have a higher density that more nearly approaches the density of the corresponding bulk material, and (2) to adhere better to the underlying surface. As a result, the coating may not flake off as readily and may be allowed to grow to a greater thickness.

On the other hand, as the RF power applied to the bias shield is increased, the ions will strike the walls of the process tube 100 with greater energies, and when the ion energies become sufficiently great, ion assisted etching, provided that the plasma contains the proper reactive species, and/or sputtering may lead to removal of the coating. Thus, control of the deposition rate of unwanted films on interior surfaces of the process tube 100 may be possible by means of the bias shield 105 when the plasma may include suitable reactive species without adverse effects on the intended wafer process.

Figure 2:
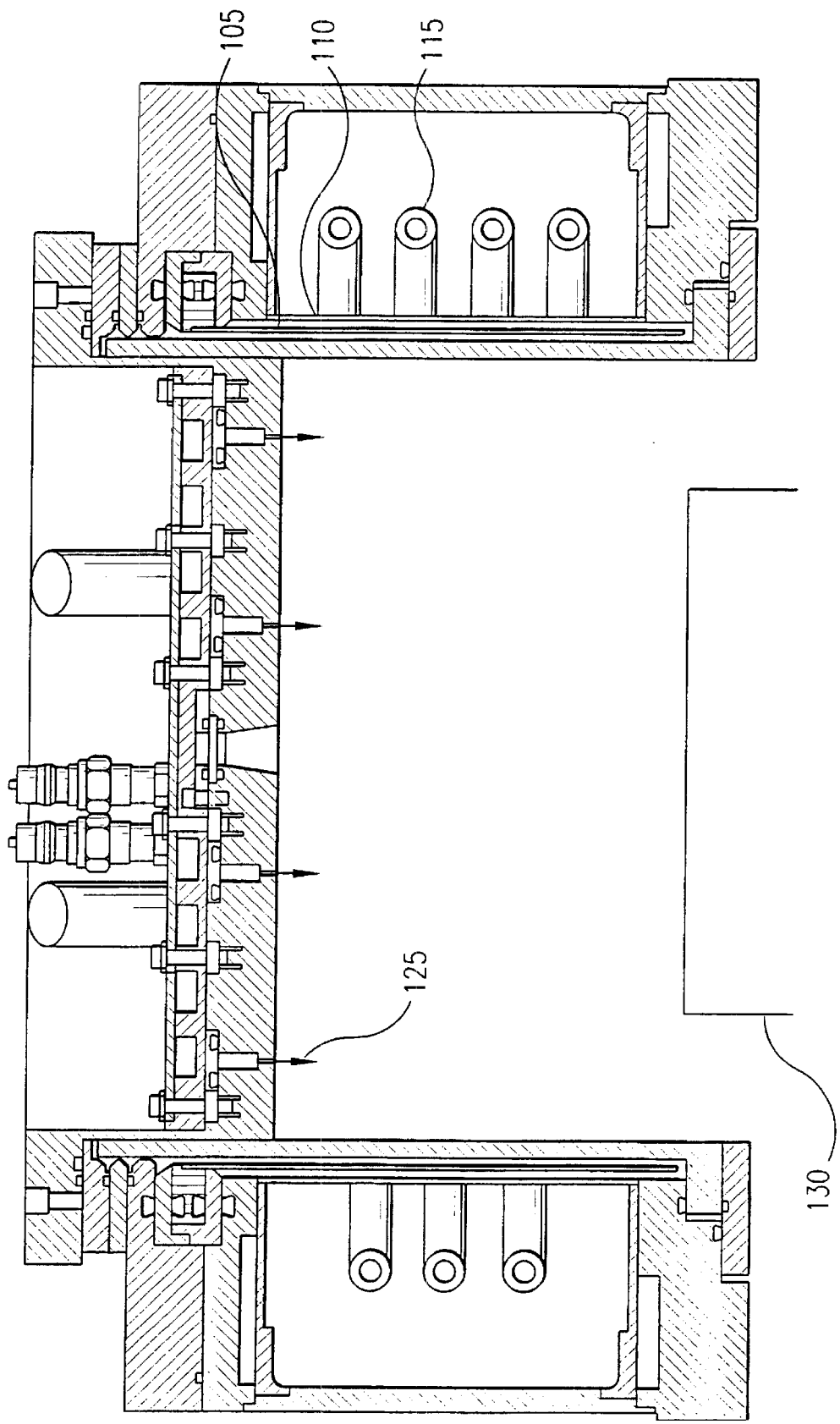
FIG. 2 is full cross-section of the ESRF source of FIG. 1.

If the removal process is primarily by sputtering rather than by ion assisted etching, it should be anticipated that some of the removed material will be redeposited on the walls of the process tube 100, and, more importantly, in a film growing on the wafer(s) 130 (shown in FIG. 2). On the other hand, if the film removal process proceeds too slowly and if the film is also electrically conductive, the thickness of the film may become so great that the film acts like an unslotted electrostatic shield, and thereby reduces the effectiveness of the inductive coupling of the RF energy from the induction coil 115 to the plasma. As a consequence, the plasma process will be affected, and properties of a growing film, such as its morphology, will, in general, be affected as well. Depending on the particular properties of the film, however, this effect may or may not occur before the film thickness becomes so great that prudence would dictate its removal to prevent particulate contamination of the reactor.

RF power may be applied to the bias shield 105 during routine wafer processing procedures or between such routine processing procedures, depending upon the experimentally determined effects of the RF power applied to the bias shield 105. In a typical deposition process, the RF bias applied to the bias shield 105 affects the deposition rate because material (that in the absence of the RF bias would remain on the wall of the process tube 100) may be removed from the wall and subsequently deposited on the wafer (substrate) 130. This source of material is, of course, different from the usual Chemical Vapor Deposition (CVD) source. Since the angle of arrival of such material and the energy of components derived from it are different from those of the components of the standard process (i.e., the process implemented in the absence of material removed from the chamber wall), the uniformity and morphology of the deposited material will likely be affected. Consequently, an adjustment of the standard process may be necessary. The adjustments may involve RF power level, chamber pressure, gas composition, and wafer position.

It is possible that the RF bias on the bias shield 105 (and, therefore, on the walls of the process tube 100) becomes so large that high removal rates of wall deposits occur and consequently high redeposition rates occur as well. Under such conditions it is probably desirable if not necessary to redesign the ESRF source. The redesigned source should provide for a greater distance between the substrate (wafer) and the walls of the process tube 100 to minimize the effects of redepositions on the composition, morphology, and uniformity of the intended films. On the other hand, too little material is disadvantageous as well. If no coating is present, the chemistry of the reaction may be changed as well. Accordingly, it is preferable to have a small amount of coating that acts as a sacrificial material.

As an alternative to the cyclic methodology of (1) processing wafers until build-ups occur and (2) taking the ESRF source off-line for cleaning, the present invention monitors and controls the thickness of the film on the walls of the process tube 100. This reduces the frequency of separate, dedicated off-line cleaning. In such cases, RF power is provided to the plasma by means of both the RF induction coil 115 and the bias shield 105. More specifically, information obtained from monitoring the thickness and composition of wall deposits can be used to adjust the RF bias on the bias shield 105. This maintains a wall coating that is (1) sufficiently thin that flaking and consequent particulate contamination do not occur, and (2) thick enough to avoid the so-called "first wafer effect," which refers to the change in processor behavior as a coating begins to form on previously clean reactor walls. Reactor walls are typically quartz, alumina, or a ceramic material; the coating, however, is usually organic. These materials have very different adsorptivities and reactivities. As the coating forms on the reactor wall, the surface properties change from the properties of the clean (inorganic) wall to the properties of the (organic) coating, and this change gives rise to the "first wafer effect" mentioned above. As a practical matter, process control is extremely difficult while this transition takes place; so after reactor cleaning, the reactor wall is recoated in a controlled way using a procedure commonly described as "conditioning the reactor." The present invention eliminates the need for reactor "conditioning."

Before discussing the measuring/controlling process of the present invention, it is noted that the effects of redepositions can be determined and techniques appropriate to compensate and/or control them can be determined with the aid of process test sequences. In such process test sequences, the reactive component in the standard process gas is replaced by a component which, although chemically similar, lacks the element crucial to the formation of the film. In addition, an inert gas for which the atomic weight is approximately equal to a reactive component of the standard process gas may be added to increase the rate at which sputtering occurs due to ion bombardment at the chamber walls.

For example, in a standard process sequence, films of oxides of silicon (SiO, $SiO_2$) are grown on a wafer from a process gas that contains $SiH_4$ (silane) and oxygen as reactive components. To study the effects of the redeposition of material removed from the chamber walls, the silane and oxygen of the standard process gas may be replaced by hydrogen ($H_2$) and argon (Ar). A possible process sequence from which information regarding the effects of redepositions may be gleaned includes these steps:

1. Start with a clean chamber. Without bias on the bias shield 105 but with a biased substrate, use the standard procedure, including the standard process gas, to coat the chamber walls.
2. Replace the wafer to eliminate the so-called "first wafer effect."
3. With substrate bias but without RF bias applied to the bias shield, characterize the PECVD films grown on the wafer with respect to deposition rate, uniformity of thickness, and stoichiometry.
4. Modify the composition of the process gas by replacing the $SiH_4$ therein by $H_2$. Insert a clean wafer and bias it as in step 3 above. In addition, apply RF bias to the bias shield. Otherwise use the same process parameters as in step 3.
5. Characterize the film grown in step 4 with respect to deposition rate, uniformity of thickness and stoichiometry.
6. Process a third wafer using the standard PECVD process but with RF power applied to the bias shield.
7. Characterize the film grown in step 6 with respect to deposition rate, uniformity of thickness and stoichiometry.

If the process gas substitution is appropriate, the properties of the film grown in step 6 should be well-represented by inference from the properties of the films grown in steps 3 and 4. The results of such analytical procedures can be used to modify in appropriate ways the standard process conditions.

Returning now to the monitoring/controlling process of the present invention, several techniques enable the thickness of thin films to be determined. Such techniques include:

1. Eddy current probes (for conducting films only) (shown in FIGS. 4A and 4B)
2. Capacitive probes
3. Ellipsometric measurements at an angle with respect to the process chamber wall surface
4. Interferometric measurements at the process chamber wall
5. Microwave transmission and/or reflection measurements at the process chamber wall
6. Optical transmission and/or interferometric measurements at the process chamber wall
7. Measurements of the oscillation frequency of a piezoelectric crystal as a consequence of a film deposited on an exposed surface.

Figure 3:
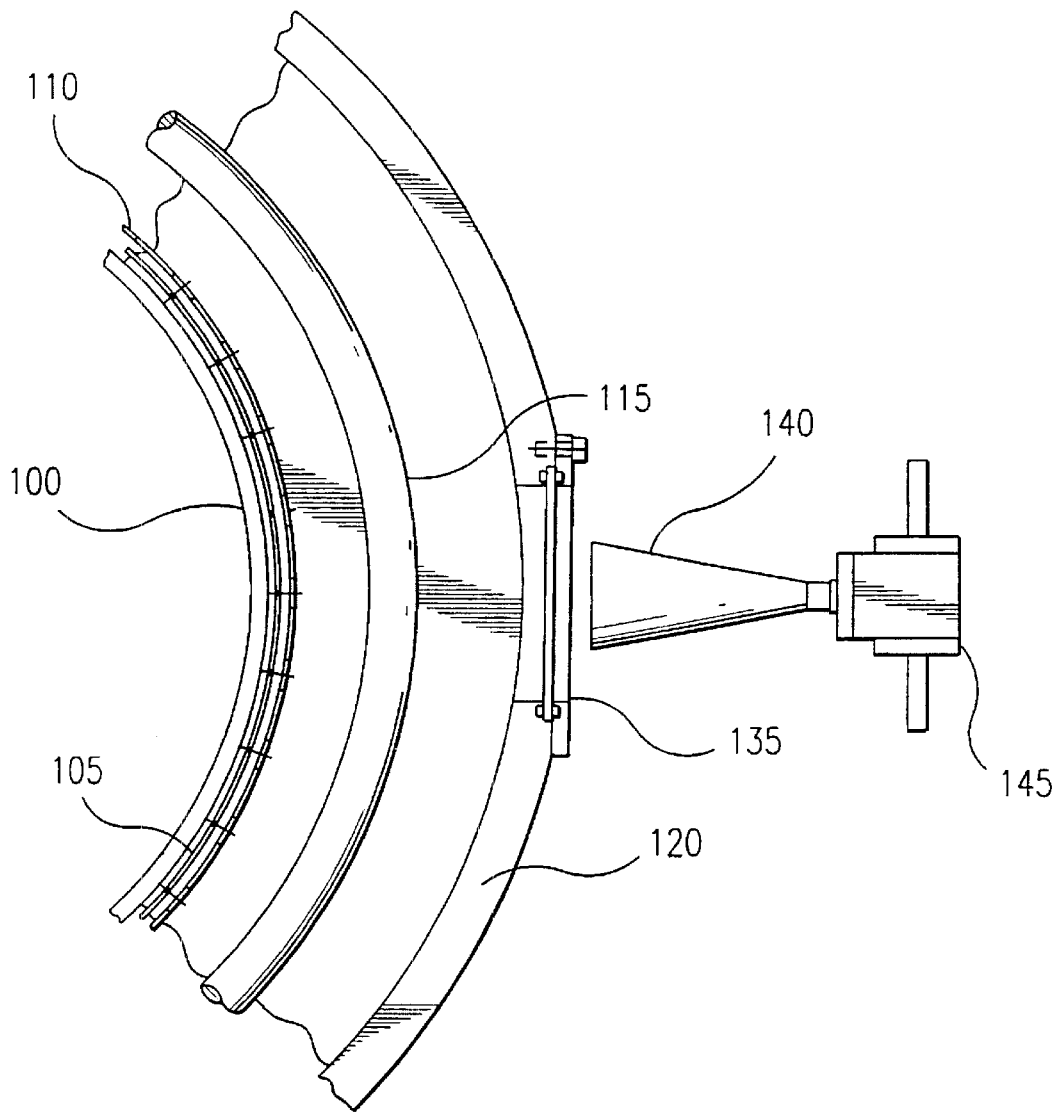
FIG. 3 is a top, sectional view showing the relative relationship between several of the components of FIG. 1.

Such measurements can be made at a plurality of locations. For example, some important locations are:

1. The region in which the deposited film is thickest
2. The region in which the deposited film is thinnest
3. The region in which the deposited film is removed at the highest rate
4. The region in which the deposited film is removed at the lowest rate FIG. 3 represents part of a first embodiment of a microwave system for monitoring the thickness of a wall coating.

The microwave signal, which may have a frequency in the range from less than 20 GHz to more than 60 GHz, is launched by means of a radiator, e.g., a horn 140 and passes through aligned apertures 135 transparent to the microwave signal in the source outer wall, the electrostatic shield 110, and the bias shield 105. In the preferred embodiment, the microwave signal has a frequency of 35 GHz. The microwave signal impinges at normal incidence on the exterior surface of the wall of the process tube 100. A portion of the microwave signal passes through the wall of the process tube 100 and is reflected from the coating on the interior surface of the process tube back to the horn 140 through the same microwave transparent apertures 135 by which it entered. Microwave techniques well-known in the art are used to determine electrical properties of the wall coating, and from them the thickness of the coating.

Figure 5:
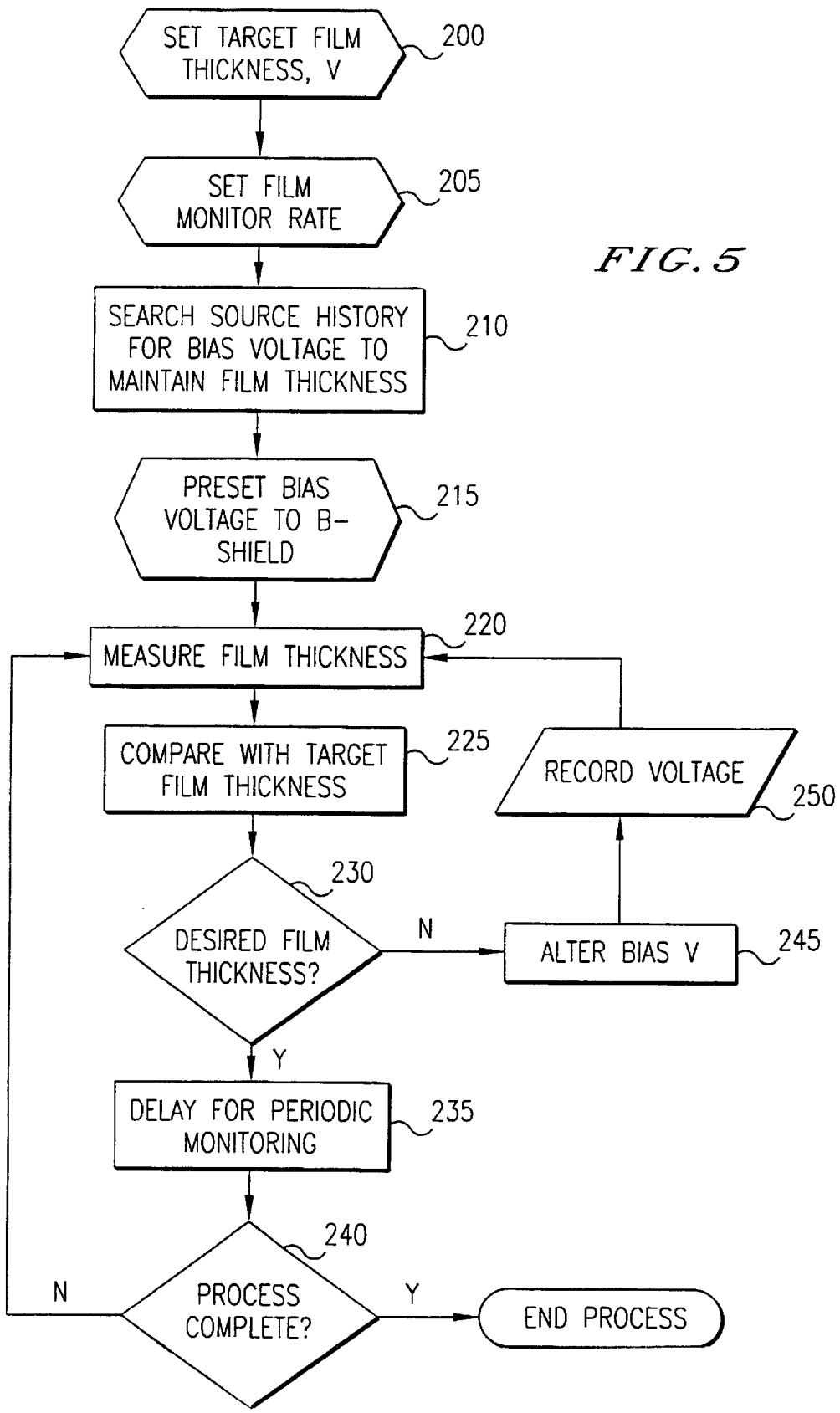
FIG. 5 is a flowchart showing a monitoring process according to the present invention.

This measuring technique is used in the monitoring and control process shown in FIG. 5. After having selected a target film thickness in step 200 and the monitoring rate in step 205, the system determines, in step 210, what bias voltage corresponds to the selected target thickness. As would be appreciated by one of ordinary skill in the art, the bias voltage will also be a function of many other parameters as well. Such parameters include, but are not limited to, the type of process being performed, the gas(es) used, and the configuration of the source. Once the pre-stored bias voltage has been found, that bias voltage is applied to the bias shield 105 in step 215.

Using the microwave measurement technique described above, the system measures the film thickness in step 220 and compares the measured film thickness with the desired film thickness in step 225. If step 230 determines that the measured thickness "matches" the desired thickness (within some error), the system delays monitoring in step 235 and checks for the end of process in step 240. If the process is not complete, the monitoring and control process returns to step 220 to take another measurement. If step 230 determines that the thicknesses do not match, the bias voltage is altered in step 245. The voltage can be increased or decreased depending on whether the film is too thick or too thin. The new voltage is recorded in step 250.

Figure 6:
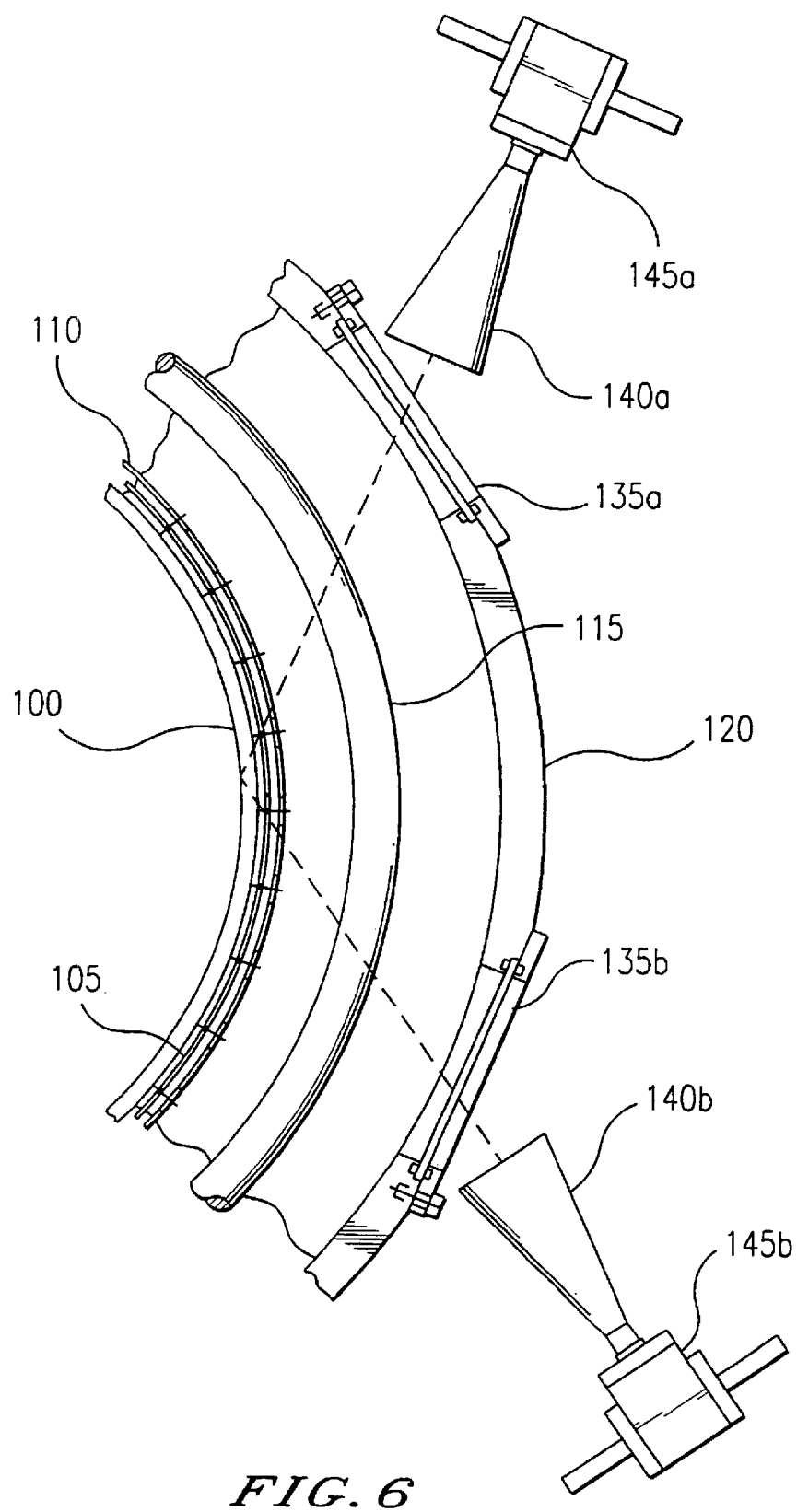
FIG. 6 is a top, sectional view of an alternate embodiment of an ESRF source using two horns.

FIG. 6 represents part of a second embodiment of a microwave system for monitoring the thickness of a wall coating. (Components in FIG. 6 that are numbered similarly to components in FIG. 3 will not be described herein again as their functions are the same.) The microwave signal impinges at oblique incidence on the exterior wall of the process tube 100 portion of the signal passes through the wall of the process tube 100 and is reflected at oblique incidence from the coating on the interior surface of the wall of the process tube 100. A second set of aligned apertures 135b transparent to the microwave signal is provided to permit the reflected microwave signal to impinge upon a microwave receiving antenna (e.g., horn 140b). As would be appreciated by one of ordinary skill in the art, the designation of transmitting and receiving horns is arbitrary, and the horn 140a could be the receiving horn when horn 140b is the transmitting horn.

Figure 7:
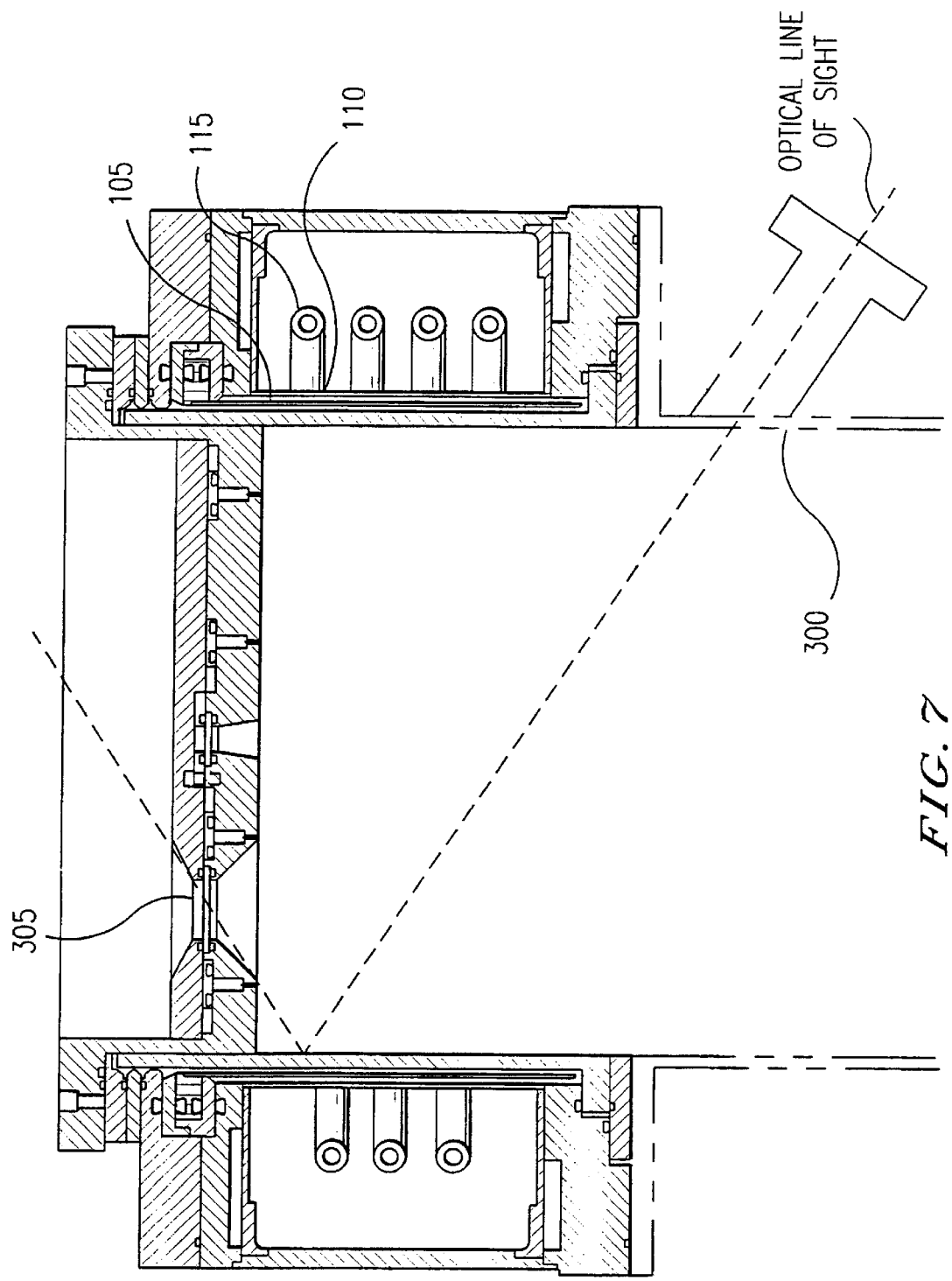
FIG. 7 is cross-section showing an optical path for measuring film thickness.

While the method of FIG. 5 was described above in terms of microwave measuring techniques using the configurations of FIGS. 3 and 6, it is also possible to use an optical measuring configuration as shown in FIG. 7.

FIG. 7 illustrates a first embodiment of an optical system for monitoring the thickness of a wall coating. In this system an optical beam enters the source through an optically transparent view port 300. As shown in FIG. 7, the view port is located in such a way that a light beam that passes through the view port impinges upon the interior surface of the reactor tube at an oblique angle. The light beam is reflected from the coating on the interior surface of the reactor tube and passes through optically transparent windows 305 as required to an optical detector (not shown). It will be readily understood that the interior surface of the reactor tube has to be of optical quality in the neighborhood of the location at which the optical beam impinges upon it.

Optical techniques well-known in the art are used to determine the optical properties of the wall coating, and, from those optical properties, the thickness of the coating. Thus, the system can control the bias voltage to control the thickness of the coating.

In yet another embodiment of the present invention, a piezoelectric material may also be used as the thickness measuring apparatus. The frequency of mechanical oscillation of a piezoelectric crystal (e.g., quartz) can be changed (tuned) by means of a thin film deposited on one or more of its surfaces. The change in the resonant frequency depends on the particular kind of crystal, the crystal cut, the crystallographic surface(s) involved, and the surface loading (g/cm$^2$) due to the deposited film. In a typical practical measurement system, one surface of a quartz crystal is exposed to the reactants or materials that are to be deposited on a substrate. The change in the resonant frequency of the crystal is related to the crystal properties, the previously determined density of the film as it forms under the process conditions, and geometrical factors. Using these data, the thickness of the film may be calculated. See U.S. Pat. No. 5,112,642: Measuring and controlling deposition on a piezoelectric monitor crystal; Abdul Wajid (May 12, 1992). See also Benes et al., Process in-situ monitoring thin film thickness by use of quartz crystals, Thin Solid Films, Vol. 174, pp. 307–314 (1989). Measurement systems of the type described here are commercially available. For example, Leybold Inficon, Inc. (East Syracuse, N.Y., USA) is a vendor of several types of thin film monitoring equipment, including their Models IC/5 Thin Film Deposition Controller and XTM/2 Thin Film Monitor, both of which use quartz crystal measurement technology.

Obviously, numerous modifications and variations of the present invention are possible in light of the above teachings. It is therefore to be understood that within the scope of the appended claims, the invention may be practiced otherwise than as specifically described herein.

What is claimed is:

1. A method of controlling the thickness of a coating on a wall of a process tube in an electrostatically shielded radio frequency plasma source, the method comprising the steps of:

selecting a target thickness of a coating on the wall of the process tube;

selecting a current bias voltage, corresponding to the target thickness, to be applied to a bias shield interposed between the process tube and an electrostatic shield;

measuring a thickness of the coating on the wall of the process tube;

comparing the measured thickness to the target thickness; and adjusting the current bias voltage if the measured thickness and the target thickness do not match.

2. The method as claimed in claim 1, wherein the step of measuring comprises measuring using a microwave signal.

3. The method as claimed in claim 2, wherein the step of measuring using a microwave signal comprises measuring an amount of a reflected microwave signal.

4. The method as claimed in claim 2, wherein the step of measuring using a microwave signal comprises measuring an amount of a microwave signal transmitted through a plasma in the process tube.

5. The method as claimed in claim 1, wherein the step of measuring comprises measuring using eddy current probes.

6. The method as claimed in claim 1, wherein the step of measuring comprises measuring using capacitive probes.

7. The method as claimed in claim 1, wherein the step of measuring comprises using ellipsometric measurements at an angle with respect to a surface of the process tube.

8. The method as claimed in claim 1, wherein the step of measuring comprises measuring using an interferometric measurement.

9. The method as claimed in claim 1, wherein the step of measuring comprises measuring using an optical signal.

10. The method as claimed in claim 9, wherein the step of measuring using an optical signal comprises measuring an amount of a reflected light.

11. The method as claimed in claim 9, wherein the step of measuring using an optical signal comprises measuring an amount of light transmitted through a plasma in the process tube.

12. The method as claimed in claim 1, wherein the step of measuring comprises measuring an oscillation frequency of a piezoelectric crystal as a film is deposited on an exposed surface of the process tube.

* * * * *